(12) United States Patent
Shen

(10) Patent No.: US 7,456,696 B2
(45) Date of Patent: Nov. 25, 2008

(54) CIRCUIT AND METHOD OF COMPENSATING FOR SIGNAL DELAY IN A CABLE

(75) Inventor: Fu-Chin Shen, Taipei Hsien (TW)

(73) Assignee: Aten International Co., Ltd., Taipei Hsien (TW)

(*) Notice: Subject to any disclaimer, the term of this patent is extended or adjusted under 35 U.S.C. 154(b) by 281 days.

(21) Appl. No.: 11/553,528

(22) Filed: Oct. 27, 2006

(65) Prior Publication Data

US 2008/0111643 A1    May 15, 2008

(51) Int. Cl.
H02J 3/22 (2006.01)
H04B 3/46 (2006.01)
H01B 11/12 (2006.01)

(52) U.S. Cl. .................. 331/74; 307/3; 326/21
(58) Field of Classification Search ............ 331/74; 326/21; 307/3
See application file for complete search history.

(56) References Cited

U.S. PATENT DOCUMENTS 4,993,026 A * 2/1991 Yamashita ............ 370/540
6,154,466 A * 11/2000 Iwasaki et al. ............ 370/466
6,465,903 B1 * 10/2002 Wuidart et al. ................ 307/3
2003/0016049 A1 * 1/2003 Wei .............................. 326/21

* cited by examiner

Primary Examiner—Joseph Chang
(74) Attorney, Agent, or Firm—Thomas, Kayden, Horstemeyer & Risley

(57) ABSTRACT

The compensation circuit comprises an oscillator, a first variable delay line, a second variable delay line, a phase detector and a controller. The oscillator generates an oscillation signal to input into a first transmission line and a second transmission line. The first variable delay line receives the oscillation signal transmitted through the first transmission line. The second variable delay line receives the oscillation signal transmitted through the second transmission line. The phase detector compares the phases of the two oscillation signals from the variable delay lines to generate a phase difference signal. The controller adjusts the variable delay lines to compensate for asynchronous signal transmission of the transmission lines according to the phase difference signal.

22 Claims, 7 Drawing Sheets

CIRCUIT AND METHOD OF COMPENSATING FOR SIGNAL DELAY IN A CABLE

BACKGROUND

1. Field of Invention

The present invention relates to a compensation circuit and method. More particularly, the present invention relates to a circuit and method of compensating for delay in a cable.

2. Description of Related Art

With the rapid development of information technology, computers and their peripherals have become very popular. Users can control computers by mice and keyboards, and monitor the states of their computers through monitors. In a computer system, video signals are transmitted to a monitor from a video adapter via a cable. When the length of the cable is too long, the video signals are considerably attenuated, thus degrading the quality of images and causing an operation error because of the unclear display.

Moreover, the cable generally has three transmission lines provided for signals of three different colors, respectively. The transmission lines may have different lengths, causing the signals transmitted thereby asynchronous. In the computer system, the distance between the monitor and the video adapter is changeable, that is, the length of the cable is also unfixed. Furthermore, for different cables, whether they are of the same length or not, their enclosed transmission lines may have different lengths. It is difficult to compensate for asynchronous signal transmission due to different lengths, especially for the cables of various lengths and types implemented in a computer system.

SUMMARY

It is an aspect of the present invention to provide a compensation circuit for a cable which mitigates asynchronous signal transmission caused by different lengths of its enclosed transmission lines.

According to one embodiment of the present invention, the cable has a first transmission line and a second transmission line. The compensation circuit comprises an oscillator, a first variable delay line, a second variable delay line, a phase detector and a controller. The oscillator generates an oscillation signal to input into the first transmission line and the second transmission line. The first variable delay line receives the oscillation signal transmitted through the first transmission line. The second variable delay line receives the oscillation signal transmitted through the second transmission line. The phase detector compares the phases of the two oscillation signals from the variable delay lines to generate a phase difference signal. The controller adjusts the variable delay lines to compensate for asynchronous signal transmission of the transmission lines according to the phase difference signal.

It is another aspect of the present invention to provide a method of compensating for delay in a cable, which can automatically compensate the asynchronous signal transmission between different transmission lines.

According to one embodiment of the present invention, the cable has a first transmission line and a second transmission line. An oscillation signal is generated to input into the first transmission line and the second transmission lines. The oscillation signal transmitted through the first transmission line is received by a first variable delay line, and the oscillation signal transmitted through the second transmission line is received by a second variable delay line. The phases of the two oscillation signals from the variable delay lines are compared to generate a phase difference signal. At least one of the variable delay lines is adjusted to compensate for asynchronous signal transmission of the transmission lines according to the phase difference signal.

It is still another aspect of the present invention to provide a computer switching system, which can achieve the RGB balance of color signals.

According to one embodiment of the present invention, the computer switching system comprises a KVM switch and a KVM extender, which are communicated with each other via a cable. The KVM switch comprises an oscillator generating an oscillation signal to input into a first transmission line and a second transmission line within the cable. The KVM extender comprises a first variable delay line, a second variable delay line, a phase detector and a controller.

The first variable delay line receives the oscillation signal transmitted through the first transmission line. The second variable delay line receives the oscillation signal transmitted through the second transmission line. The phase detector compares the phases of the two oscillation signals from the variable delay lines to generate a phase difference signal. The controller adjusts the variable delay lines to compensate for asynchronous signal transmission of the transmission lines according to the phase difference signal.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
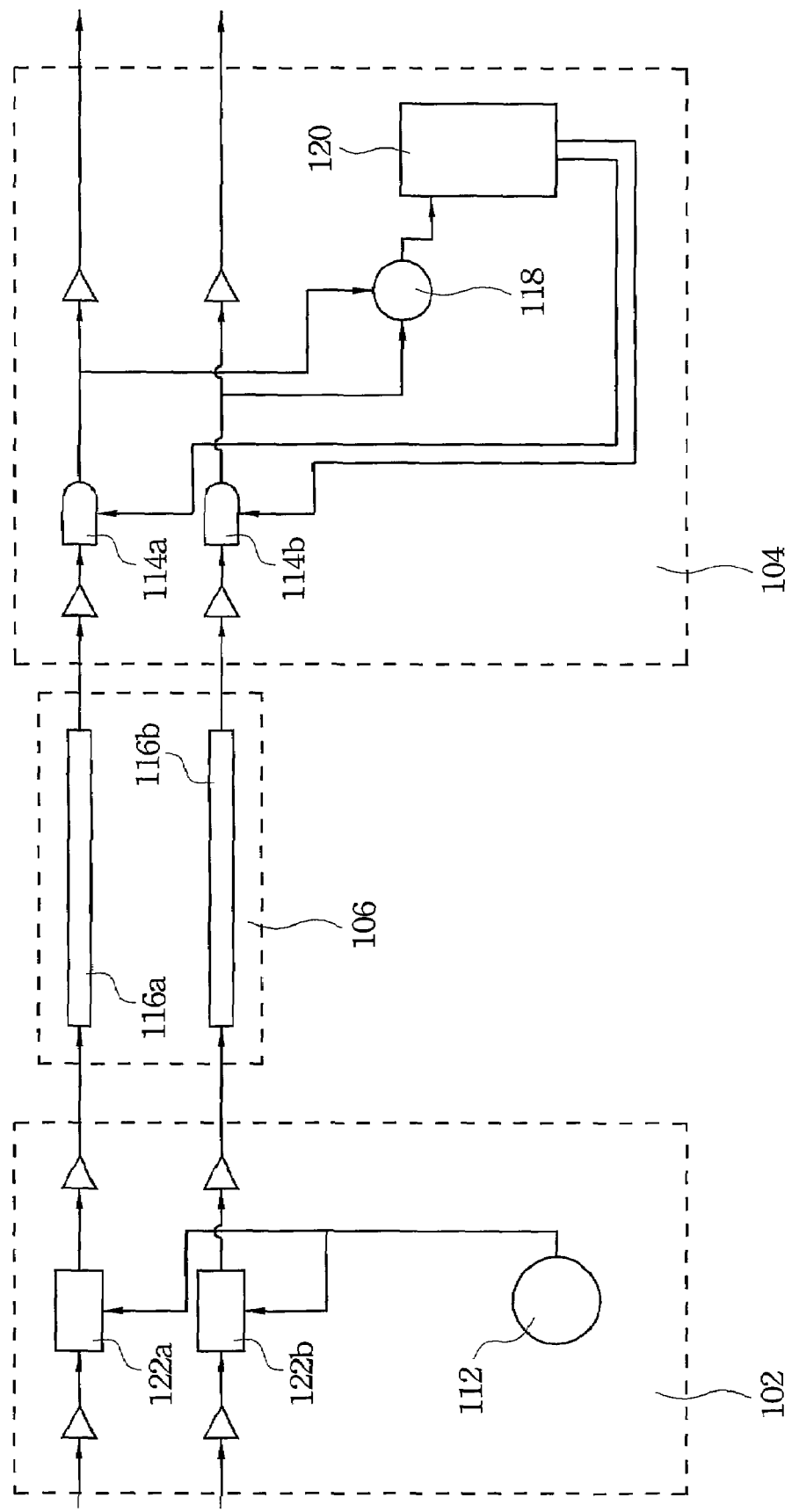
FIG. 1 is a compensation circuit according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a compensation circuit according to one embodiment of the present invention. A cable 106, which is capable of connection between a first device 102 and a second device 104, has a first transmission line 116a and a second transmission line 116b provided for transmitting analog signals, respectively. These transmission lines 116a and 116b are generally twisted within the cable 106, thus particularly having different lengths that may cause asynchronous signal transmission.

The compensation circuit has an oscillator 112, a first variable delay line 114a, a second variable delay line 114b, a phase detector 118 and a controller is 120. The oscillator 112 generates an oscillation signal to input into the first transmission line 116a and the second transmission line 116b. The first variable delay line 114a receives the oscillation signal transmitted through the first transmission line 116a; and the second variable delay line 114b receives the oscillation signal transmitted through the second transmission line 116b. The phase detector 118 compares the phases of the two oscillation signals from the variable delay lines 114a and 114b to generate a phase difference signal. The controller 120 adjusts the variable delay lines 114a and 114b to compensate for asynchronous signal transmission of the transmission lines 116a and 116b according to the phase difference signal.

More particularly, the aforementioned analog signals can be video signals, color signals, sound signals, voltage signals or other suitable analog signals. The oscillation signals may be of a certain frequency, for example, of 5 MHz or 100 MHz, which can be decided according to the analog signals that the cable 106 transmits. The identical oscillation signals are initially inputted into and thus transmitted by the transmission lines 116a and 116b, and after the transmission, the transmitted oscillation signals are affected by the lengths, or even the qualities, of the transmission lines 116a and 116b, respectively.

The variable delay lines 114a and 114b are connected to the transmission lines 116a and 116b and provided to compensate for asynchronous signal transmission according to the phase difference between the two transmitted oscillation signals. In practical, the asynchronous signal transmission here may be caused by the transmission lines 116a and 116b, the unadjusted variable delay lines 114a and 114b and/or other electrical components involved in the whole signal transmission. Therefore, the delay of the variable delay lines 114a and 114b may be adjusted by one or more times to mitigate the asynchronous signal transmission.

The compensation circuit further has a first multiplexer 122a and a second multiplexer 122b. The first multiplexer 122a is arranged to select one from a first analog signal and the oscillation signal to input into the first transmission line 116a. The second multiplexer 122b is arranged to select one from a second analog signal and the oscillation signal to input into the second transmission line 116b. The first and second analog signals are transmitted from the first device 102 to the second device 104 via the cable 106 in a normal operation. When the signal compensation is processed, for example, at the beginning of the communication between the two devices 102 and 104 or while the user instructing to optimize the signal synchronization, the first and second multiplexers 122a and 122b switch to both input the oscillation signals into the first and second transmission line 116a and 116b for the afterward phase detection.

Figure 2:
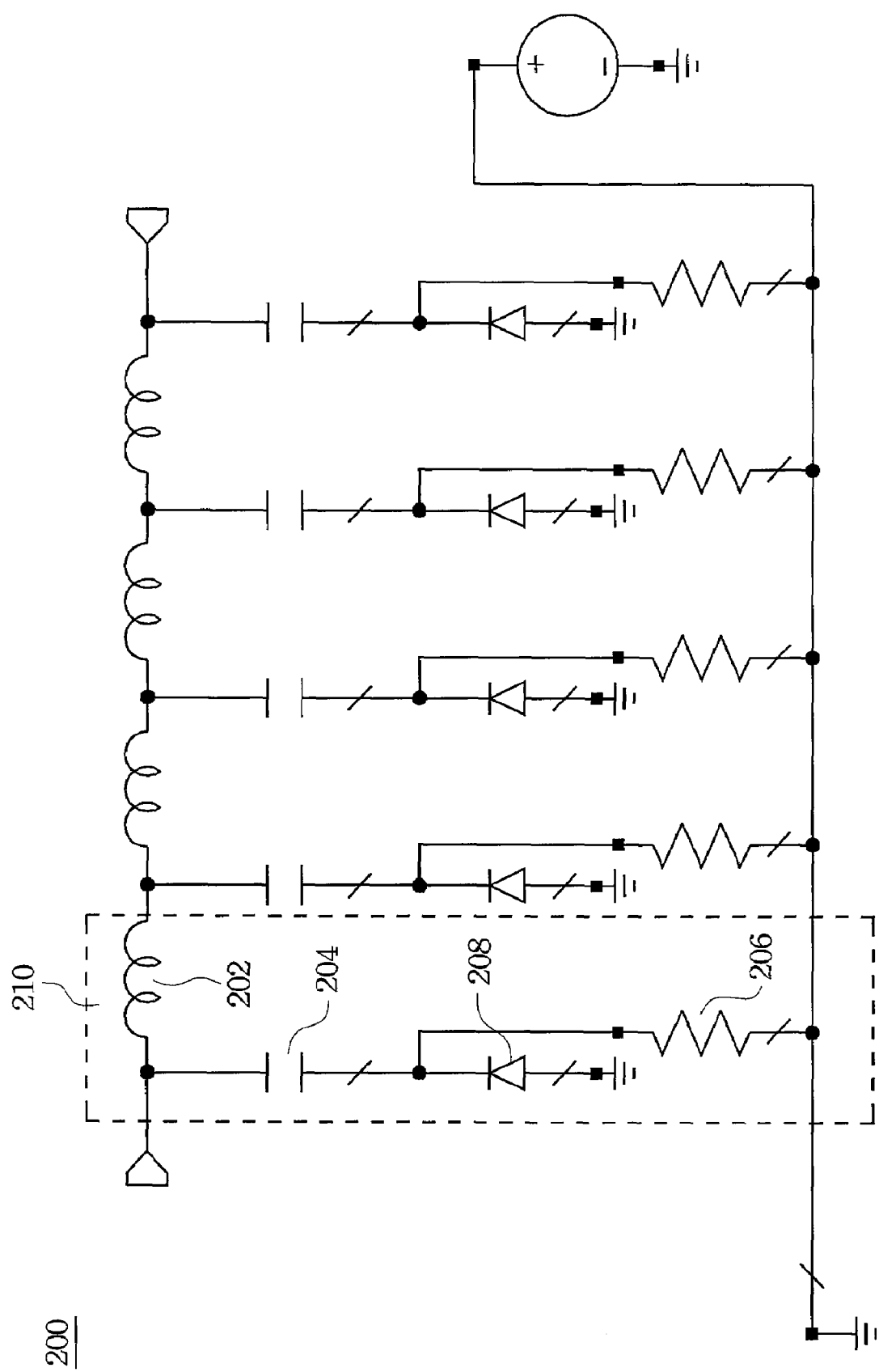
FIG. 2 is an exemplary variable delay line according to one embodiment of the present invention.

FIG. 2 is an exemplary variable delay line according to one embodiment of the present invention, which can be used as the first variable delay line 114a or the second variable delay line 114b as illustrated in FIG. 1. The variable delay line 200 theoretically stimulates a transmission line with at least one sections 210 including inductors 202, capacitors 204 and resistors 206 electrically connected together. Each section 210 further has a tunable capacitor, adjustable inductor or adjustable resistor. The tunable capacitor can be a voltage-controlled variable capacitor 208, for example, a varactor diode, of which the capacitance can be controlled by an applied voltage, such as an adjusting voltage generated from the controller 120 in FIG. 1. By the tunable capacitance of the voltage-controlled variable capacitor 208, the delay of the variable delay line 200 is correspondingly changed in accordance with the phase difference between the two transmitted oscillation signals.

Alternatively, other types of variable delay lines also can be implemented in the embodiments of the present invention. For example, the variable delay line having tunable capacitor, adjustable inductor, adjustable resistor or their combinations, which affect the delay of the variable delay line, can be selectively used to be the first variable delay line 114a or the second variable delay line 114b as illustrated in FIG. 1. In addition, the first variable delay line 114a and the second variable delay line 114b may include the same or different electrical components, whether the quantities, the types, or the connections of them.

In order to correctly compensate for the asynchronous signal transmission, the controller 120 should be aware of the relationship between the phase difference signal and the adjusting voltage. That is, the phase difference signal is generated according to the phase difference between the two transmitted oscillation signals, representing how asynchronous the transmitted signals are due to different lengths of the transmission lines 116a and 116b. The adjusting voltage depends on the phase difference signal to change the delay of the variable delay line 200, and therefore the relationship between the phase difference signal and the adjusting voltage is required, such as with a table or a database storing in the memory inside or outside the controllers 120.

Figure 3:
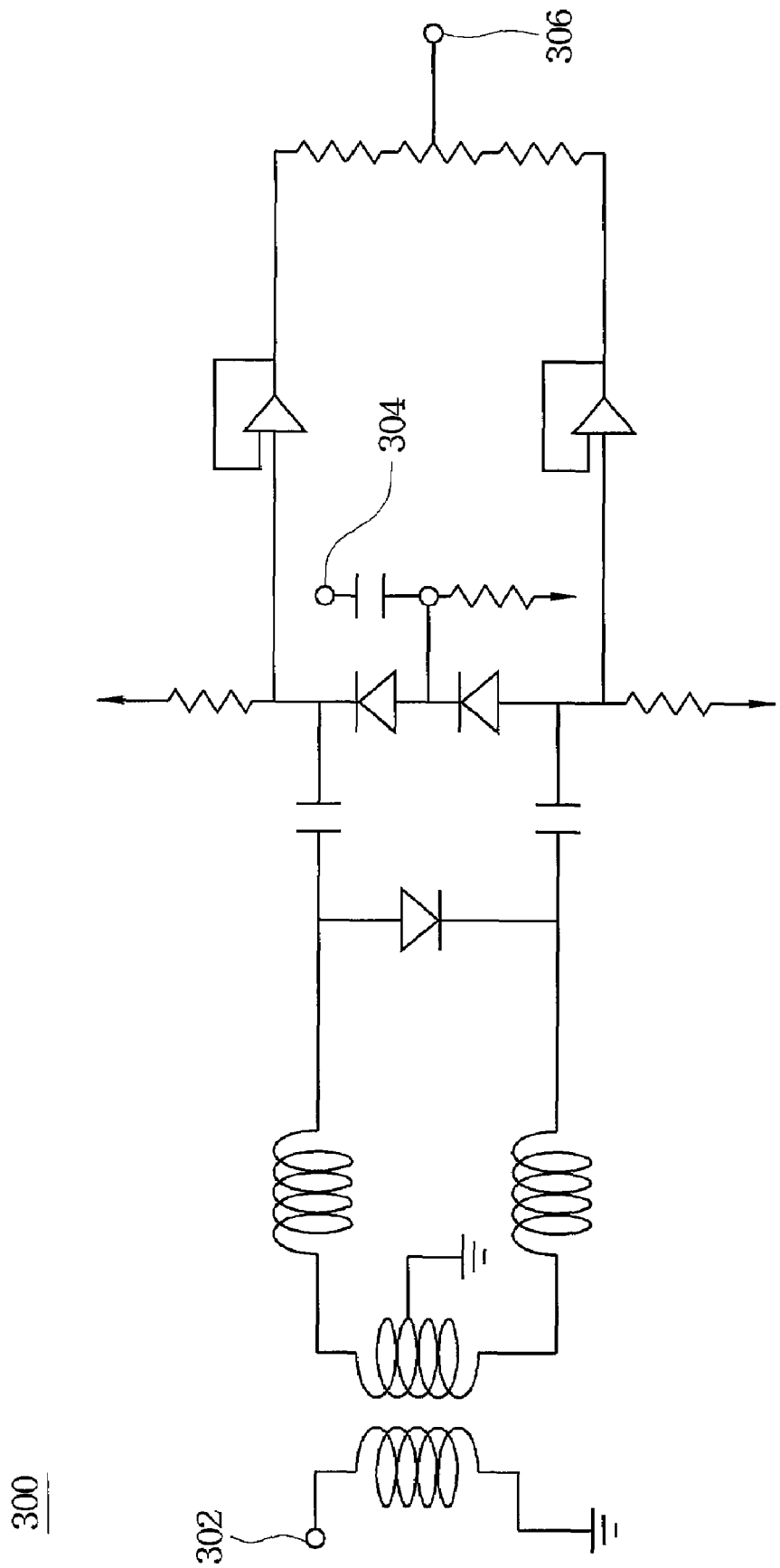
FIG. 3 is an exemplary phase detector according to one embodiment of the present invention.

FIG. 3 is an exemplary phase detector according to one embodiment of the present invention. In the phase detector 300, one of the oscillation signals transmitted from the variable delay lines 114a and 114b is applied to a reference input end 302, the other is applied to another input end 304, and the phase difference signal is then generated to output from an output end 306. The phase detector 300 is simple and available, and the person skilled in the art should be able to implement other suitable phase detector for detecting the phase difference between the transmitted oscillation signals.

Figure 4:
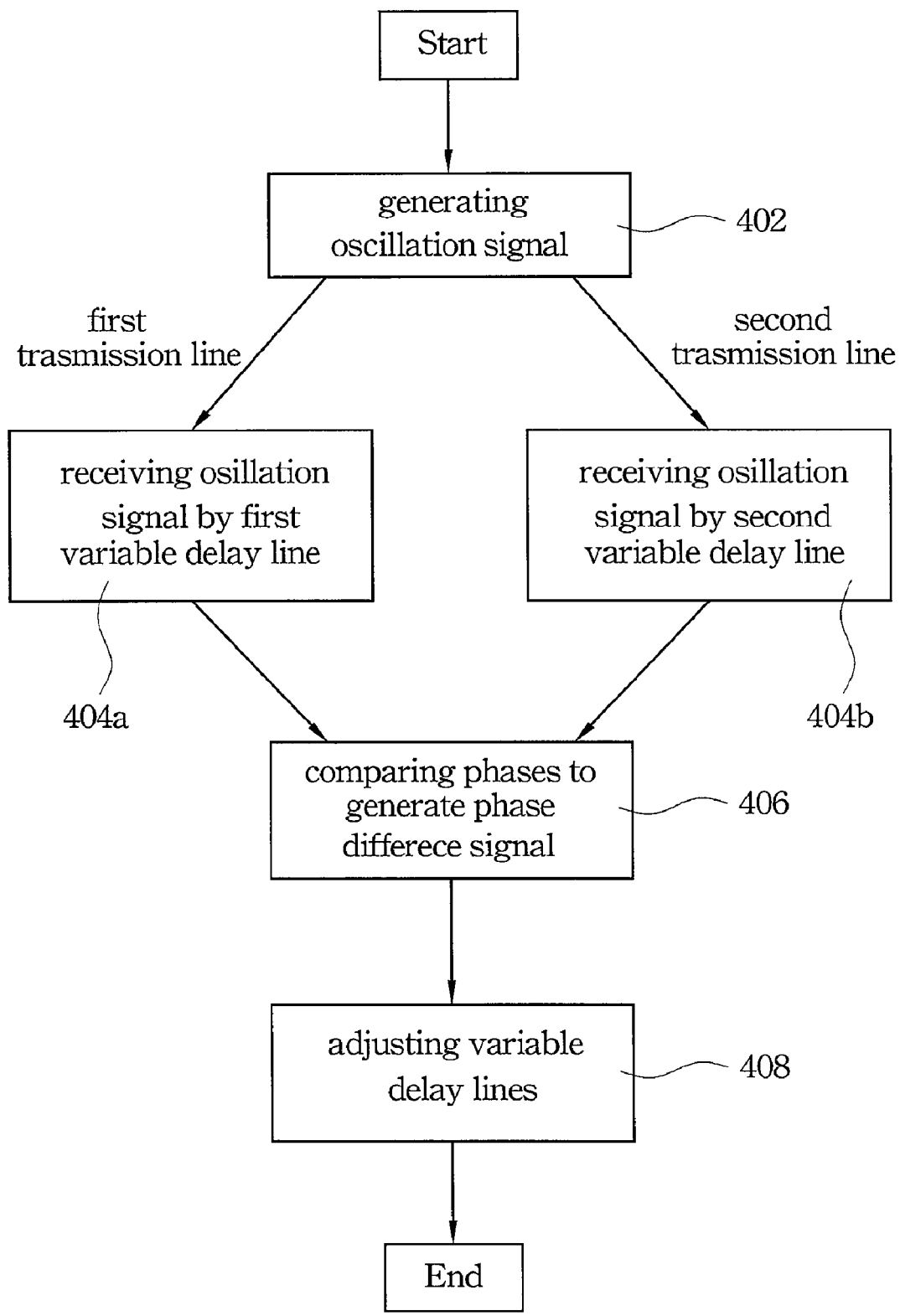
FIG. 4 is a flow chart of a method of compensating for delay in a cable according to one embodiment of the present invention.

FIG. 4 is a flow chart of a method of compensating for delay in a cable according to one embodiment of the present invention. The following descriptions are made with reference to FIG. 1. An oscillation signal is generated to input into the first transmission line 116a and the second transmission lines 116b (step 402). The oscillation signal transmitted through the first transmission line 116a is received by a first variable delay line 114a (step 404a), and the oscillation signal transmitted through the second transmission line 116b is received by a second variable delay line 114b (step 404b). The phases of the two oscillation signals from the variable delay lines 114a and 114b are compared to generate a phase difference signal (step 406). At least one of the variable delay lines 114a and 114b is adjusted to compensate for asynchronous signal transmission of the transmission lines 116a and 116b according to the phase difference signal (step 408).

As mentioned above, each of the variable delay lines 114a and 114b has at least one voltage-controlled variable capacitor 208. The voltage-controlled variable capacitor 208 can be a varactor diode controlled by an adjusting voltage. The relationship between the phase difference signal and the adjusting voltage is pre-stored, for example, in a memory inside or outside the controller 120.

Figure 5:
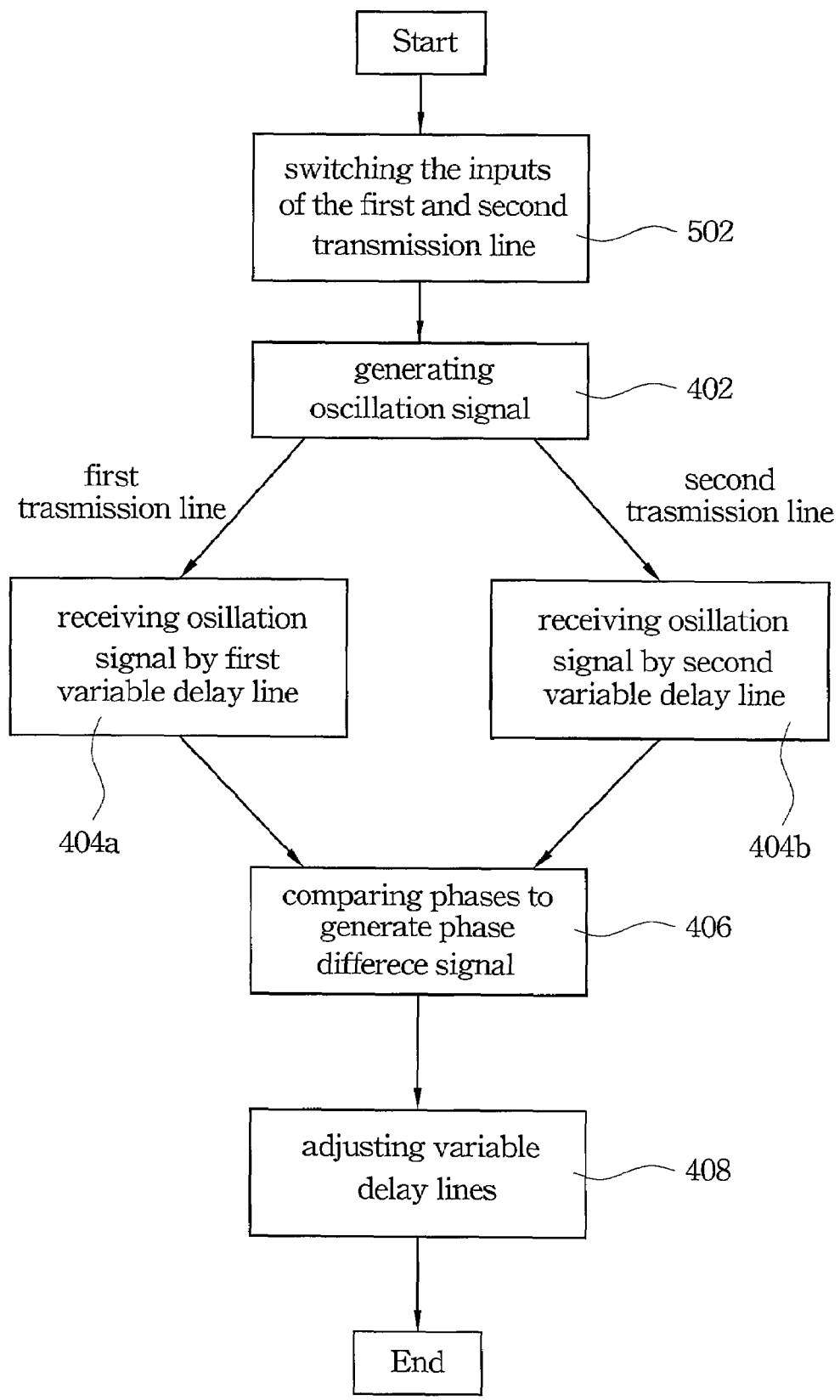
FIG. 5 is a flow chart of the method of compensating for delay in a cable according to another embodiment of the present invention.

FIG. 5 is a flow chart of the method of compensating for delay in a cable according to another embodiment of the present invention, which includes more steps to illustrate the procedure of signal compensation. When the signal compensation is started, for example, at the beginning of the communication between the two devices 102 and 104, the oscillator 112 is firstly triggered to generate the oscillation signal, and the outputs of the variable delay lines 114a and 114b are switched to the phase detector 118.

Then, the input of the first transmission line 116a is switched from a first analog signal to the oscillation signal, as well as the input of the second transmission line 116b is switched from a second analog signal to the oscillation signal (step 502). That is, the analog signals, which should be transmitted from the first device 102 to the second device 104, are temporarily block from the signal transmission and replaced by the oscillation signal for phase detection. However, in some conditions, the analog signals and the oscillation signal may be simultaneously transmitted through the cable 106 by special frequency design, or by implementing signal filters or other devices.

Figure 6A:
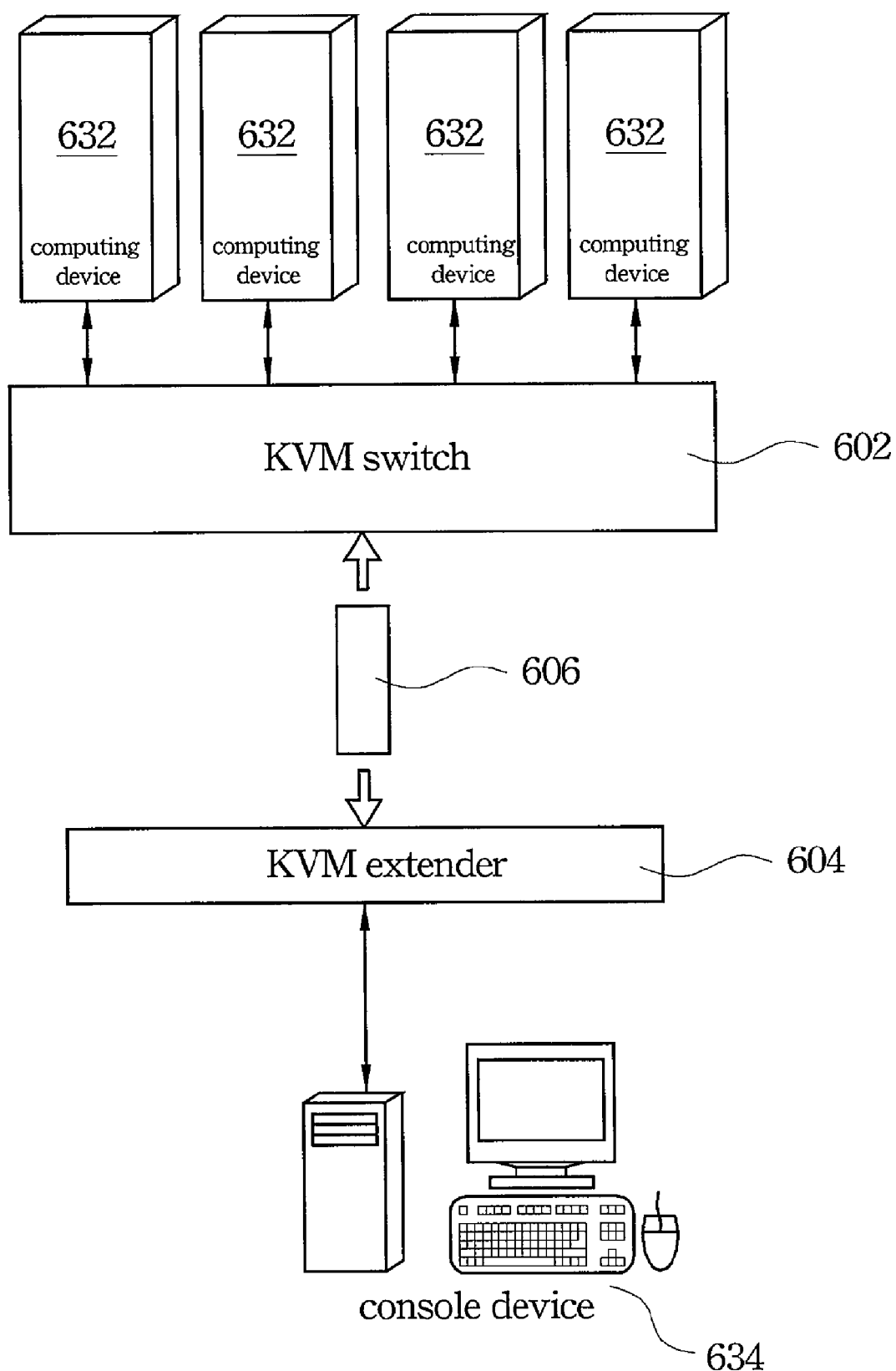
FIG. 6A is a computer switching system according to one embodiment of the present invention.

FIG. 6A is a computer switching system according to one embodiment of the present invention. The computer switching system includes a KVM (keyboard-video-mouse) switch 602 and a KVM extender 604, which are communicated with each other via a cable 606. The KVM switch 602 is proposed to use a single console device 634 to manage several computing device 632 through the KVM extender 604. The KVM switch 602 and the computing devices 632 may be disposed on a computer center distant from an office that the KVM extender 604 and the console device 634 is placed in, and the cable 606 connected between the KVM switch 602 and KVM extender 604 is therefore very long, probably over 300 yards.

Figure 6B:
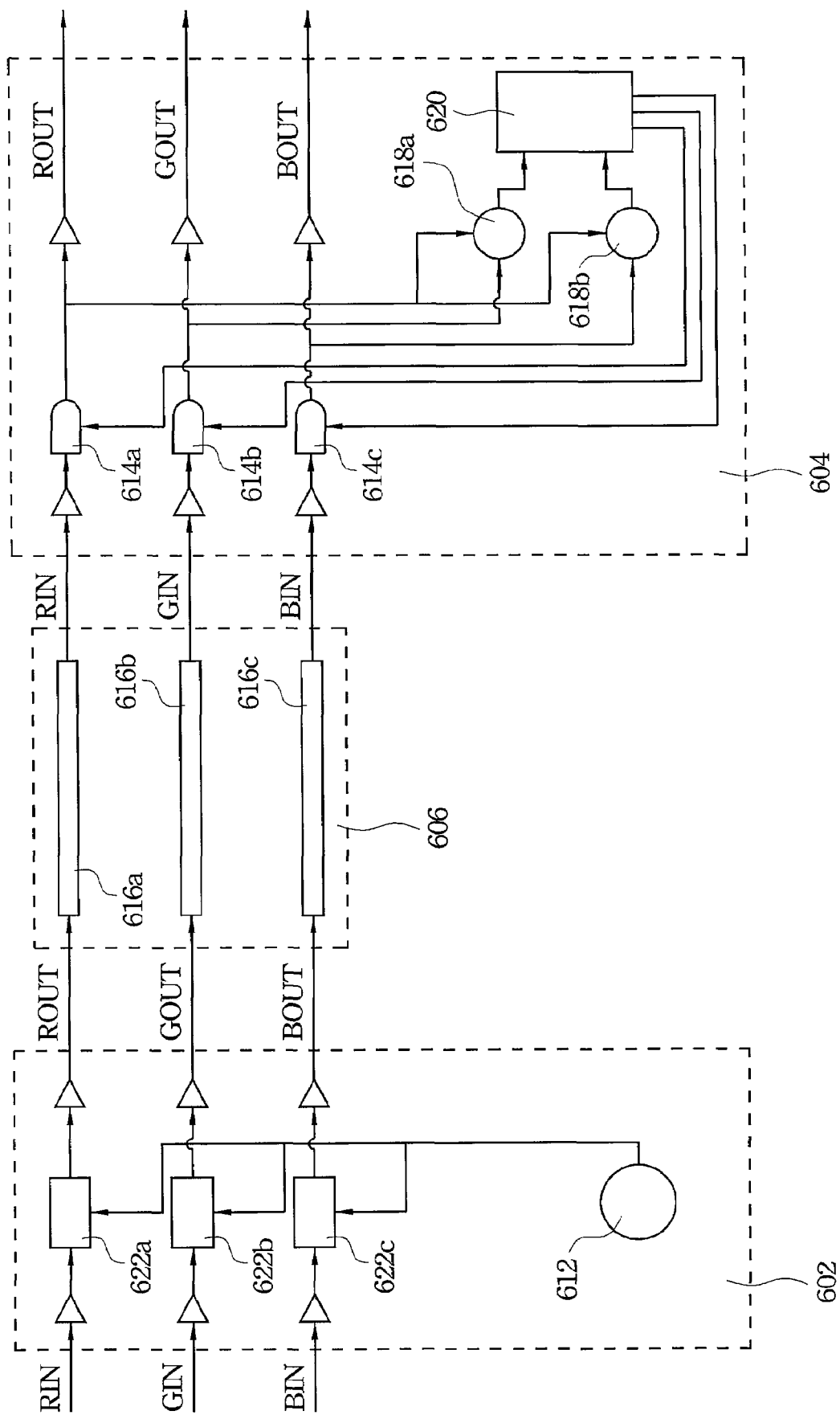
FIG. 6B is a functional block of the computer switching system illustrated in FIG. 6A.

FIG. 6B is a functional block of the computer switching system illustrated in FIG. 6A. In the embodiment, the analog signals transmitted from the KVM switch 602 to the KVM extender 604 are color signals, such as the red (R), green (G) and blue (B) color signals, which are transmitted through transmission lines 616a, 616b and 616c within the cable 606, respectively. As mentioned above, with respect to the three transmission lines, any two of them may have asynchronous signal transmission. Therefore, at least two sets of two oscillation signals transmitted through the transmission lines 616a, 616b and 616c are selected to compare their phases in the embodiment.

The KVM switch 602 has an oscillator 612, which generates an oscillation signal to input into a first transmission line 616a, a second transmission line 616b and a third transmission line 616c. The KVM extender 604 has a first variable delay line 614a, a second variable delay line 614b, a third variable delay line 614c, a first phase detector 618a, a second phase detector 618b and a controller 620.

The first variable delay line 614a receives the oscillation signal transmitted through the first transmission line 616a. The second variable delay line 614b receives the oscillation signal transmitted through the second transmission line 616b. The third variable delay line 614c receives the oscillation signal transmitted through the third transmission line 616c.

Each of the he first and second phase detectors 618a and 618b compares the phases of two of the oscillation signals from the variable delay lines 614a, 614b and 614c to generate a phase difference signal. For example, the first phase detector 618a compares the oscillation signals from the variable delay lines 614a and 614b, and the second phase detector 618b compares the oscillation signals from the variable delay lines 614a and 614c.

Then, the controller 620 adjusts at least one of the variable delay lines 614a, 614b and 614c to compensate for asynchronous signal transmission of the transmission lines 616a, 616b and 616c according to the phase difference signals. By this architecture, the variable delay lines 614a, 614b and 614c may be adjusted by one or more times to mitigate the asynchronous signal transmission of the transmission lines 616a, 616b and 616c of the cable 606.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A compensation circuit for a cable having a first transmission line and a second transmission line, the compensation circuit comprising:
   an oscillator arranged to generate an oscillation signal to input into the first transmission line and the second transmission line;
   a first variable delay line arranged to receive the oscillation signal transmitted through the first transmission line;
   a second variable delay line arranged to receive the oscillation signal transmitted through the second transmission line;
   a phase detector arranged to compare the phases of the two oscillation signals from the variable delay lines to generate a phase difference signal; and
   a controller arranged to adjust the variable delay lines to compensate for asynchronous signal transmission of the transmission lines according to the phase difference signal.

2. The compensation circuit as claimed in claim 1, wherein each of the variable delay lines comprises at least one tunable capacitor, adjustable inductor or adjustable resistor.

3. The compensation circuit as claimed in claim 2, wherein the tunable capacitor is a voltage-controlled variable capacitor.

4. The compensation circuit as claimed in claim 3, wherein the voltage-controlled variable capacitor is a varactor diode controlled by an adjusting voltage generated from the controller.

5. The compensation circuit as claimed in claim 4, wherein the controller stores a relationship between the phase difference signal and the adjusting voltage.

6. The compensation circuit as claimed in claim 1, further comprising:
   a first multiplexer arranged to select one from a first analog signal and the oscillation signal to input into the first transmission line; and
   a second multiplexer arranged to select one from a second analog signal and the oscillation signal to input into the second transmission line.

7. The compensation circuit as claimed in claim 1, wherein the oscillator is configured in a first device, the first variable delay line, the second variable delay line, the phase detector and the controller is configured in a second device, and the first device communicates with the second device via the cable.

8. The compensation circuit as claimed in claim 1, wherein each of the variable delay lines comprises electrically connected capacitors, resistors and inductors.

9. A method of compensating for delay in a cable having a first transmission line and a second transmission line, the method comprising the steps of:
   generating an oscillation signal to input into the first transmission line and the second transmission lines;
   receiving the oscillation signal transmitted through the first transmission line by a first variable delay line;

receiving the oscillation signal transmitted through the second transmission line by a second variable delay line;

comparing the phases of the two oscillation signals from the variable delay lines to generate a phase difference signal; and adjusting the variable delay lines to compensate for asynchronous signal transmission of the transmission lines according to the phase difference signal.

10. The method as claimed in claim 9, wherein each of the variable delay lines comprises at least one tunable capacitor, adjustable inductor or adjustable resistor.

11. The method as claimed in claim 10, wherein the tunable capacitor is a voltage-controlled variable capacitor.

12. The method as claimed in claim 11, wherein the voltage-controlled variable capacitor is a varactor diode controlled by an adjusting voltage.

13. The method as claimed in claim 12, wherein a relationship between the phase difference signal and the adjusting voltage is pre-stored.

14. The method as claimed in claim 9, further comprising the steps of:

switching the input of the first transmission line from a first analog signal to the oscillation signal; and switching the input of the second transmission line from a second analog signal to the oscillation signal.

15. The method as claimed in claim 9, further comprising:

triggering the oscillator to generate the oscillation signal; and switching the outputs of the variable delay lines to the phase detector.

16. A computer switching system, comprising:

a KVM switch, comprising:

an oscillator arranged to generate an oscillation signal to input into a first transmission line and a second transmission line of a cable; and a KVM extender communicating with the KVM switch via the cable, the KVM extender comprising:

a first variable delay line arranged to receive the oscillation signal transmitted through the first transmission line;

a second variable delay line arranged to receive the oscillation signal transmitted through the second transmission line;

a phase detector arranged to compare the phases of the two oscillation signals from the variable delay lines to generate a phase difference signal; and a controller arranged to adjust the variable delay lines to compensate for asynchronous signal transmission of the transmission lines according to the phase difference signal.

17. The computer switching system as claimed in claim 16, wherein each of the variable delay lines comprises at least one tunable capacitor, adjustable inductor or adjustable resistor.

18. The computer switching system as claimed in claim 17, wherein the tunable capacitor is a voltage-controlled variable capacitor.

19. The computer switching system as claimed in claim 18, wherein the voltage-controlled variable capacitor is a varactor diode controlled by an adjusting voltage generated from the controller.

20. The computer switching system as claimed in claim 18, wherein the controller stores a relationship between the phase difference signal and the adjusting voltage.

21. The computer switching system as claimed in claim 16, wherein the KVM switch further comprises:

a first multiplexer arranged to select one from a first color signal and the oscillation signal to input into the first transmission line; and a second multiplexer arranged to select one from a second color signal and the oscillation signal to input into the second transmission line.

22. The computer switching system as claimed in claim 16, wherein each of the variable delay lines comprises electrically connected capacitors, resistors and inductors.

* * * * *